United States Patent
Van Houdt

(10) Patent No.: US 12,439,673 B2
(45) Date of Patent: Oct. 7, 2025

(54) SPLIT GATE FERROFET

(71) Applicant: IMEC VZW, Leuven (BE)

(72) Inventor: Jan Van Houdt, Bekkevoort (BE)

(73) Assignee: IMEC VZW, Leuven (BE)

( * ) Notice: Subject to any disclaimer, the term of this patent is extended or adjusted under 35 U.S.C. 154(b) by 60 days.

(21) Appl. No.: 18/069,010

(22) Filed: Dec. 20, 2022

(65) Prior Publication Data

US 2023/0197807 A1    Jun. 22, 2023

(30) Foreign Application Priority Data

Dec. 21, 2021  (EP) ...................................... 21216257

(51) Int. Cl.
| | |
|---|---|
| *H10D 64/00* | (2025.01) |
| *H10B 51/30* | (2023.01) |
| *H10D 30/01* | (2025.01) |
| *H10D 30/69* | (2025.01) |
| *H10D 64/01* | (2025.01) |
| *H10D 64/27* | (2025.01) |

(52) U.S. Cl.
CPC ........... *H10D 64/511* (2025.01); *H10B 51/30* (2023.02); *H10D 30/0415* (2025.01); *H10D 30/701* (2025.01); *H10D 64/033* (2025.01)

(58) Field of Classification Search
CPC ............. H10D 64/511; H10D 30/0415; H10D 30/701; H10D 64/033; H10B 51/30; H01L 29/4232; H01L 29/40111; H01L 29/6684; H01L 29/78391
USPC ........................................................ 257/295
See application file for complete search history.

(56) References Cited

U.S. PATENT DOCUMENTS

| | | | | |
|---|---|---|---|---|
| 6,744,087 B2* | 6/2004 | Misewich | .............. | H10B 51/30 257/295 |
| 11,527,649 B1* | 12/2022 | Huang | ................ | H01L 21/2236 |
| 2003/0047779 A1* | 3/2003 | Peake | .................. | H10D 12/038 257/E29.066 |
| 2004/0245564 A1* | 12/2004 | Ogura | .................... | H10B 51/30 257/E21.663 |

(Continued)

FOREIGN PATENT DOCUMENTS

KR    20200026668 A    3/2020

OTHER PUBLICATIONS

Extended European Search Report and Written Opinion, Application No. EP 21216257.2, mailed Jun. 15, 2022, 8 pages.

(Continued)

*Primary Examiner* — Sheikh Maruf
(74) *Attorney, Agent, or Firm* — McDonnell Boehnen Hulbert & Berghoff LLP

(57) ABSTRACT

The present disclosure provides a ferroelectric field-effect transistor comprising: a substrate comprising a source region, a channel, and a drain region; a ferroelectric material arranged on a first portion of the channel and a portion of the drain region; a program gate arranged on the ferroelectric material and being at least coextensive with the first portion of the channel; a gate dielectric arranged on a portion of the source region and a second portion of the channel; and a select gate arranged on the gate dielectric and being at least coextensive with said portion of the source region and the second portion of the channel; wherein a well of the substrate extending under the whole channel has a uniform doping level.

17 Claims, 4 Drawing Sheets

(56) References Cited

U.S. PATENT DOCUMENTS

| | | | | |
|---|---|---|---|---|
| 2005/0280065 | A1* | 12/2005 | Iwata | H10D 64/033 257/E21.208 |
| 2007/0176218 | A1* | 8/2007 | Kang | H10D 30/701 257/295 |
| 2007/0228432 | A1* | 10/2007 | Ishihara | H10B 51/30 257/295 |
| 2009/0021986 | A1* | 1/2009 | Wong | H10B 43/30 365/185.18 |
| 2014/0254276 | A1* | 9/2014 | Tokuhira | G11C 16/0466 365/185.17 |
| 2015/0060875 | A1* | 3/2015 | Kume | H01L 29/66659 257/344 |
| 2015/0060983 | A1* | 3/2015 | Lusetsky | H10D 30/0413 438/257 |
| 2015/0129972 | A1* | 5/2015 | Choi | H10D 84/85 257/369 |
| 2016/0035856 | A1* | 2/2016 | van Bentum | H10B 51/40 257/295 |
| 2016/0049420 | A1* | 2/2016 | Chang | H01L 21/02601 438/591 |
| 2016/0155855 | A1* | 6/2016 | Ramaswamy | H10D 84/82 257/295 |
| 2016/0181259 | A1* | 6/2016 | Van Houdt | H10D 64/033 257/295 |
| 2016/0225429 | A1* | 8/2016 | Toh | G11C 11/1659 |
| 2016/0240622 | A1* | 8/2016 | Fan | H10D 30/0411 |
| 2016/0322368 | A1* | 11/2016 | Sun | H10B 51/20 |
| 2016/0322466 | A1* | 11/2016 | Simin | H10D 30/021 |
| 2017/0178712 | A1* | 6/2017 | Van Houdt | H10D 64/033 |
| 2018/0076334 | A1* | 3/2018 | Ando | H10D 30/0415 |
| 2018/0151746 | A1* | 5/2018 | Tu | H10D 64/689 |
| 2018/0286875 | A1* | 10/2018 | Okada | H10D 30/69 |
| 2019/0198080 | A1* | 6/2019 | Salahuddin | G11C 11/223 |
| 2020/0144293 | A1* | 5/2020 | Majhi | H10D 64/033 |
| 2020/0194591 | A1* | 6/2020 | Kim | H01L 21/28185 |
| 2020/0350415 | A1* | 11/2020 | Chuang | H10D 84/0144 |
| 2021/0066318 | A1* | 3/2021 | Chang | G11C 11/5657 |
| 2021/0091227 | A1* | 3/2021 | Heo | H01L 29/517 |
| 2021/0280721 | A1* | 9/2021 | Gros-Jean | H01L 29/78391 |
| 2021/0305397 | A1* | 9/2021 | Vellianitis | H10D 30/0415 |
| 2021/0408282 | A1* | 12/2021 | Tiwari | H10D 64/01 |
| 2022/0020855 | A1* | 1/2022 | Liao | H10D 30/0415 |
| 2022/0246766 | A1* | 8/2022 | Manfrini | H10D 30/6739 |
| 2022/0351769 | A1* | 11/2022 | Chen | H01L 29/78391 |
| 2023/0231029 | A1* | 7/2023 | Rajashekhar | H10D 64/689 257/295 |

OTHER PUBLICATIONS

Hu, Vita Pi-Ho, Hung-Han Lin, Zhe-An Zheng, Zih-Tang Lin, Yi-Chun Lu, Lun-Yi Ho, Yen-Wei Lee, Cheng-Wei Su, and Chun-Jun Su. "Split-gate FeFET (SG-FeFET) with dynamic memory window modulation for non-volatile memory and neuromorphic applications." In 2019 Symposium on VLSI Technology, pp. T134-T135. IEEE, 2019.

* cited by examiner

SPLIT GATE FERROFET

CROSS-REFERENCE TO RELATED APPLICATIONS

The present application is a non-provisional patent application claiming priority to European Patent Application No. EP 21216257.2, filed Dec. 21, 2021, the contents of which are hereby incorporated by reference.

FIELD OF THE DISCLOSURE

The present disclosure is related to a ferroelectric field-effect transistor. In particular, the present disclosure relates to a ferroelectric field-effect transistor with a split gate.

BACKGROUND

Planar ferroelectric field-effect transistors (FeFETs) often suffer from a variability of a threshold voltage (Vt) of the FeFETs which makes them difficult to control, e.g. in a large memory array.

The low Vt state is a difficult one to control as low values may result in leakage currents in AND-type arrays (similar to the over-erase issue in NOR-type flash arrays). Since the low Vt state is often used as the programmed or 'information' state while (the high Vt state is used for block erase), verify techniques may not be useful in this case and over-programming may also be an issue.

When considering the voltages needed to balance the ferroelectric switching with electron injection (to maximize a read window), the voltages may correspond to partial polarization only, which makes the variability larger than in the high Vt state.

Moreover, since the write/erase operations in FeFETs are only using one voltage (applied at the gate), a NOR-type array is impossible for selectively decoding conventional FeFET arrays. The conventional solution is to use an AND-type array that requires buried bitlines as well as buried source lines (so-called virtual ground array) that generate parasitic voltage drops in the read operation, leading to slower access times. The variability on the low Vt mentioned above may make this problem even worse.

Accordingly, there are too many boundary conditions on the read operation of conventional FeFETs to guarantee a good read window in large FeFET arrays.

SUMMARY

The present disclosure provides a FeFET that is easier to control and thereby e.g. suitable for use in a large FeFET array.

The disclosure provides a ferroelectric field-effect transistor. The ferroelectric field-effect transistor comprises: a substrate comprising a source region, a channel, and a drain region; a ferroelectric material arranged on a first portion of the channel and a portion of the drain region; a program gate arranged on the ferroelectric material and being at least coextensive with the first portion of the channel; a gate dielectric arranged on a second portion of the source region and a portion of the channel; and a select gate arranged on the gate dielectric and being at least coextensive with said portion of the source region and the second portion of the channel; wherein a well of the substrate extending under the whole channel has a uniform doping level.

In some embodiments, a controlled channel is arranged in series with a ferroelectrically controlled channel using a split gate transistor structure. This may mitigate the variability of the low Vt state identified above because the low Vt is fixed by the (conventionally controlled) second channel portion.

Additionally, negative control voltages, which are energy inefficient, may be avoided compared to a conventional FeFET by e.g. grounding the select gate.

In some embodiments, a split gate transistor structure allows for selective over-programming without leakage because each gate is individually controllable and the current is fixed by the second channel portion.

These effects in combination further enables the FeFET to be used in NOR-type arrays, which increases stability and speed relative to the AND-type arrays.

The uniform doping level in combination with the split gate transistor structure provides for an increased read window as depletion may be used in the channel region of the substrate.

In some embodiments, the well extends under the whole channel, resulting in simplified alignment during manufacturing.

The term "at least coextensive" describes that the two components are coextensive, but one component may be larger than what it is being at least coextensive with.

According to one embodiment the uniform doping level is less than $10^{19}$ cm$^{-3}$.

In some embodiments, the uniform doping may further enable using depletion in the channel region of the substrate.

According to one embodiment the ferroelectric material is Hafnia- or Wurtzite-based.

These materials may enable a depolarization field that is small compared to the coercive field, which in turn may further using depletion in the channel region of the substrate.

According to one embodiment the program gate is arranged to be coextensive with the ferroelectric material.

This may be simple to manufacture and align.

According to one embodiment the gate dielectric is further arranged on a portion of the program gate; and wherein the select gate extends above a portion of the program gate with a gate dielectric therebetween.

This may simplify manufacturing and back end of line contacting.

According to another embodiment, there is provided a non-volatile memory array. The array comprises: a plurality of ferroelectric field-effect transistors according to the first aspect; a set of word lines, bit lines, program lines, and source lines electrically connecting the plurality of ferroelectric field-effect transistors; wherein the word lines are connected to select gates of the ferroelectric field-effect transistor; the program lines are connected to program gates of the ferroelectric field-effect transistor; the source lines are connected to source regions of the ferroelectric field-effect transistors; and the bit lines are connected to drain regions of the ferroelectric field-effect transistor.

According to one embodiment the bit lines are physically connected to each ferroelectric field-effect transistor in a non-diffused manner.

This corresponds to the memory array being of a NOR-type.

The FeFETs of the present inventive concept is especially suitable for this type of array, which may have an added benefit of being stable.

BRIEF DESCRIPTION OF THE DRAWINGS

The above, as well as additional features will be better understood through the following illustrative and non-limiting detailed description, with reference to the appended drawings. In the drawings, like reference numerals will be used for like elements unless stated otherwise.

DETAILED DESCRIPTION

Figure 1:
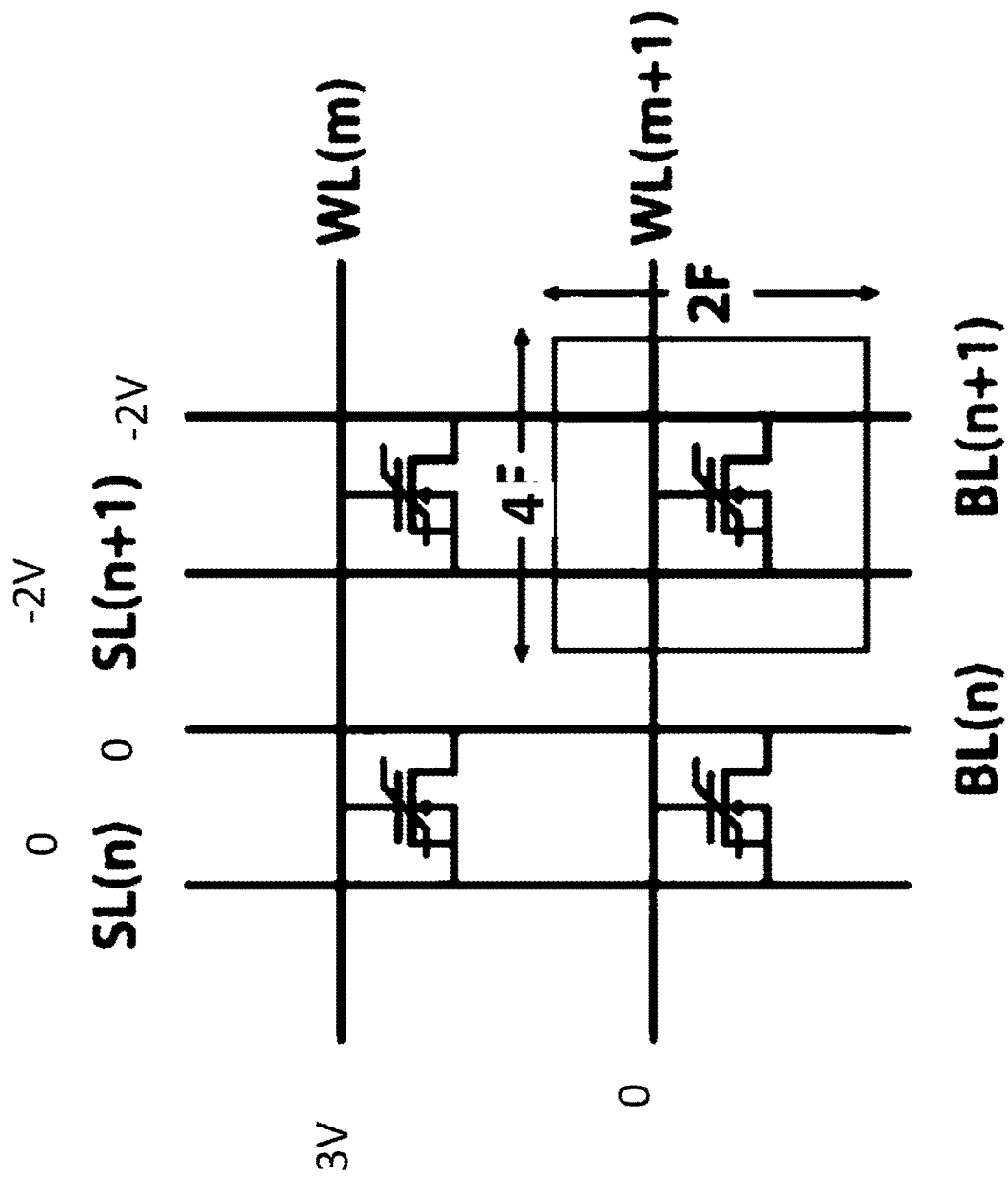
FIG. 1 illustrates an example of an AND-type memory array.

FIG. 1 illustrates a prior art example of an AND-type memory array using conventional ferroelectric field-effect transistors (FeFETs). This because a conventional FeFET only has a single gate and not a split gate, which will be described in relation to the following figures.

The AND-type array comprises a two-dimensional array of FeFETs with a word line, source line and bit line connected to each FeFET.

In order to selectively read the state of the top left FeFET of the array, the voltages shown in FIG. 1 may be utilized. Accordingly, a negative inhibit voltage may be applied to the source lines (SL) and bit lines (BL) of the FeFETs along the same (selected) word line (WL) as the read FeFET, in order to bias these unselected FeFETs to not have a large enough applied bias to affect the read operation.

The FeFETs have two voltage thresholds (Vt), one low Vt and one high Vt, where an applied voltage causes sharp increase in current.

Further, the FeFETs may be overprogrammed, i.e. have a negative Vt. In order for such FeFETs to not affect the read operation along the negatively biased source line and bit line, it may be necessary to negatively bias the unselected word lines as well.

Such a large number of negative voltages may require significant energy and time to generate and also a large periphery of circuitry to generate it.

For low Vt the absolute value may be less than 1V, hence the selectivity of the read operation may be even lower due to leakage currents unless e.g. negative voltages are applied to the unselected WL. This is especially relevant for flash memory arrays, as these require low Vt.

This issue is even more complicated because Vt may vary for FeFETs, hence a certain minimum range (window) for the (effective) read voltage applied may be required to ensure that Vt is reached despite an expected variability. Additionally, the variation may cause the low Vt value to be negative, which even further increases leakage currents.

The variability of Vt may be greater for the low Vt values than for the high Vt values as the low Vt may correspond to partial polarization of the ferroelectric switching material.

One possible solution to variable Vt is to verify each FeFET's Vt individually after programming and use e.g. an erase pulse to adjust any Vt that is too small. However, this is time- and energy consuming and for such an erase pulse to be selective to a particular cell would require a negative gate bias and negative inhibit voltages on unselected SL and BL, which takes a lot of time and a large periphery.

The boxed-in FeFET has a size of $8F^2$, where F is a feature size, as marked in FIG. 1. In order to ensure that this FeFET fits, the SL and BL may be buried to reduce a requirement on contact size. However, diffusion resistance of such contacts may cause larger voltage drops over the FeFET, which may negatively affect read speeds.

Figure 2:
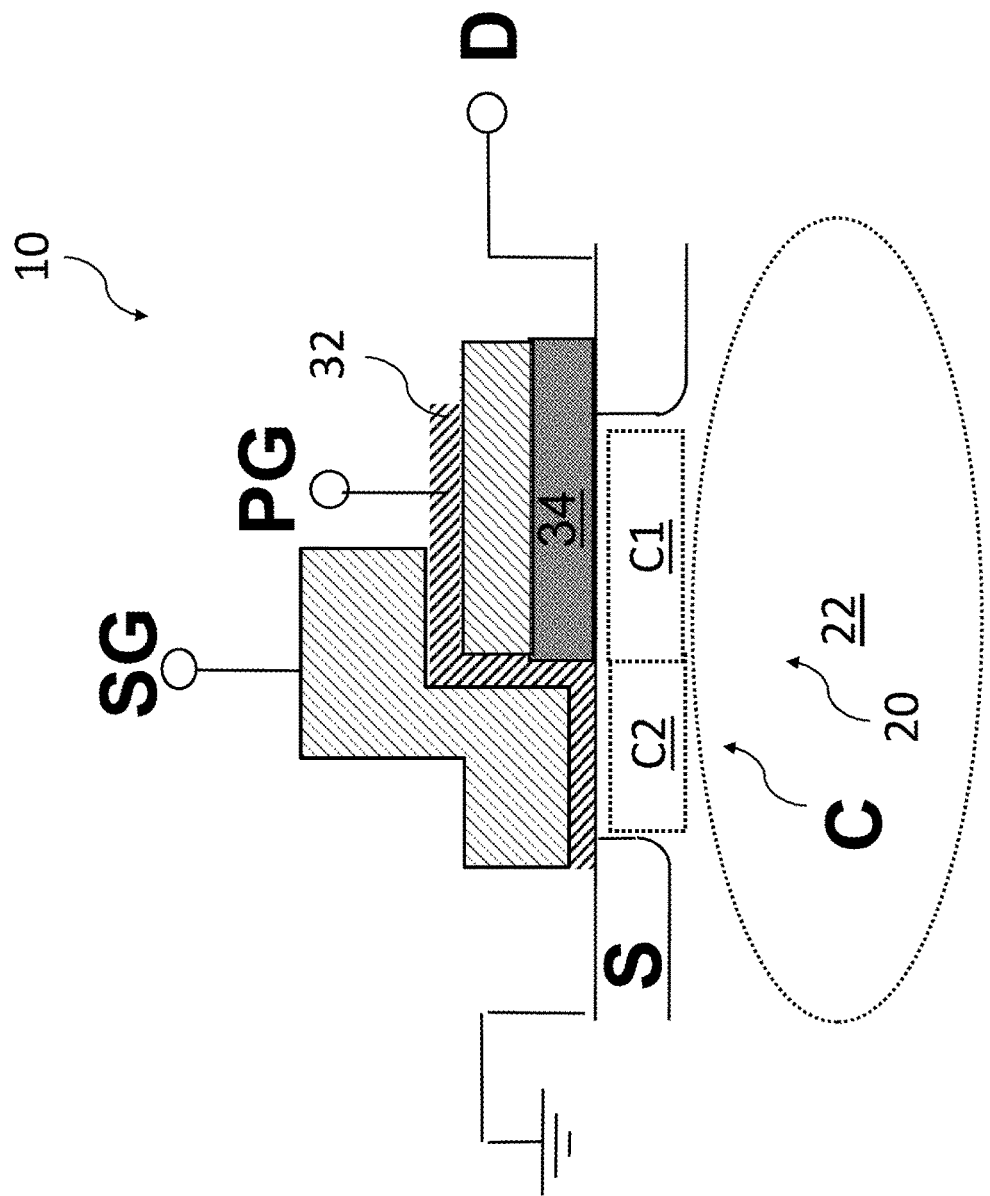
FIG. 2 illustrates a cross-sectional view of a FeFET according to disclosed embodiments.

FIG. 2 illustrates a FeFET 10 according to an example. The FeFET 10 comprises a substrate 20 comprising a source region S, a channel C, and a drain region D. The channel C comprises a first portion C1 and a second portion C2. The different portions C1, C2 of the channel C are shown as having different lengths, however the lengths may vary e.g. depending on the fabrication process. The source and drain regions S, D may be doped.

The substrate may be, for example, bulk substrates of elemental semiconductors of e.g. silicon, germanium and/or compound semiconductors of e.g. silicon germanium, GaAs, InGaAs, ZnSe, GaN. Moreover, it may be possible to employ multilayer substrates such as a silicon on insulator (SOI) substrate, a silicon on sapphire substrate or ceramics, glass or plastic substrate on top of which a semiconductor layer is processed. The semiconductor substrate or the semiconductor layer may be single crystal (by, for example, epitaxial growth), polycrystalline or amorphous although there may be variations in the quantity of current flowing inside.

The substrate 20 may further comprise a well 22 extending under the whole channel C. The well 22 has a uniform doping level.

The FeFET 10 may further comprise a ferroelectric material 34 arranged on the first portion C1 of the channel and a portion of the drain region D. The ferroelectric material 34 may e.g. be hafnia- or wurtzite-based.

The FeFET 10 may further comprise a program gate PG arranged on the ferroelectric material 34. The program gate PG may e.g. be made of a traditional gate metal. The program gate PG may as shown be coextensive with the ferroelectric material 34.

The FeFET 10 may further comprise a gate dielectric 32 arranged on a portion of the source region S, a second portion C2 of the channel, the ferroelectric material 34, and the program gate PG. The gate dielectric 32 may e.g. be made of a traditional gate dielectric.

The FeFET 10 may further comprise a select gate SG arranged on the gate dielectric 32 and being at least coextensive with said portion of the source region S and the second portion C2 of the channel. The select gate SG may e.g. be made of a traditional gate metal.

The gate dielectric 32 may be arranged only on a portion of the source region S and a second portion C2 of the channel, however if as shown the select gate SG extends above the program gate PG the gate dielectric 32 is arranged between the select gate SG and the program gate PG to electrically isolate them from each other.

The channel C is thereby separated into a first portion C1 under the ferroelectric material 34 and a second portion C2 under the dielectric 32. These portions C1, C2 may be separately controlled by the program gate PG and select gate SG, respectively.

This split gate architecture thereby enables separate control over the different channel portions C1, C2 having different electrical properties by virtue of being arranged under different materials.

In this way, the issues arising from variable Vt in some FeFETs may thereby be compensated for by the second channel portion C2 under the dielectric 32. This second channel portion C2 may have a larger Vt than first channel portion C1 and is stable, thereby the Vt of the entire channel C is fixed by the Vt of the second channel portion C2, resulting in a stable read current.

The second channel portion C2 further prevents over-programming of the first channel portion C1. This means that the FeFET 10 may be used in a NOR-array as will be described further in relation to FIG. 4.

Further, having two gates SG, PG may be used to inhibit leakage currents by e.g. grounding one gate of unselected FeFETs 10, thereby negative inhibit voltages may be avoided.

The well 22 may have a positive doping bias. This enables an erase operation to be performed with a positive voltage, thereby eliminating all negative voltages for control.

The well 22 may have a uniform doping level less than $10^{19}$ cm$^{-3}$, such as $10^{17}$ to $5\times10^{18}$ cm$^{-3}$. This doping level may enable depletion and inversion of the channel C, which increases a window for possible read voltages.

Figure 3:
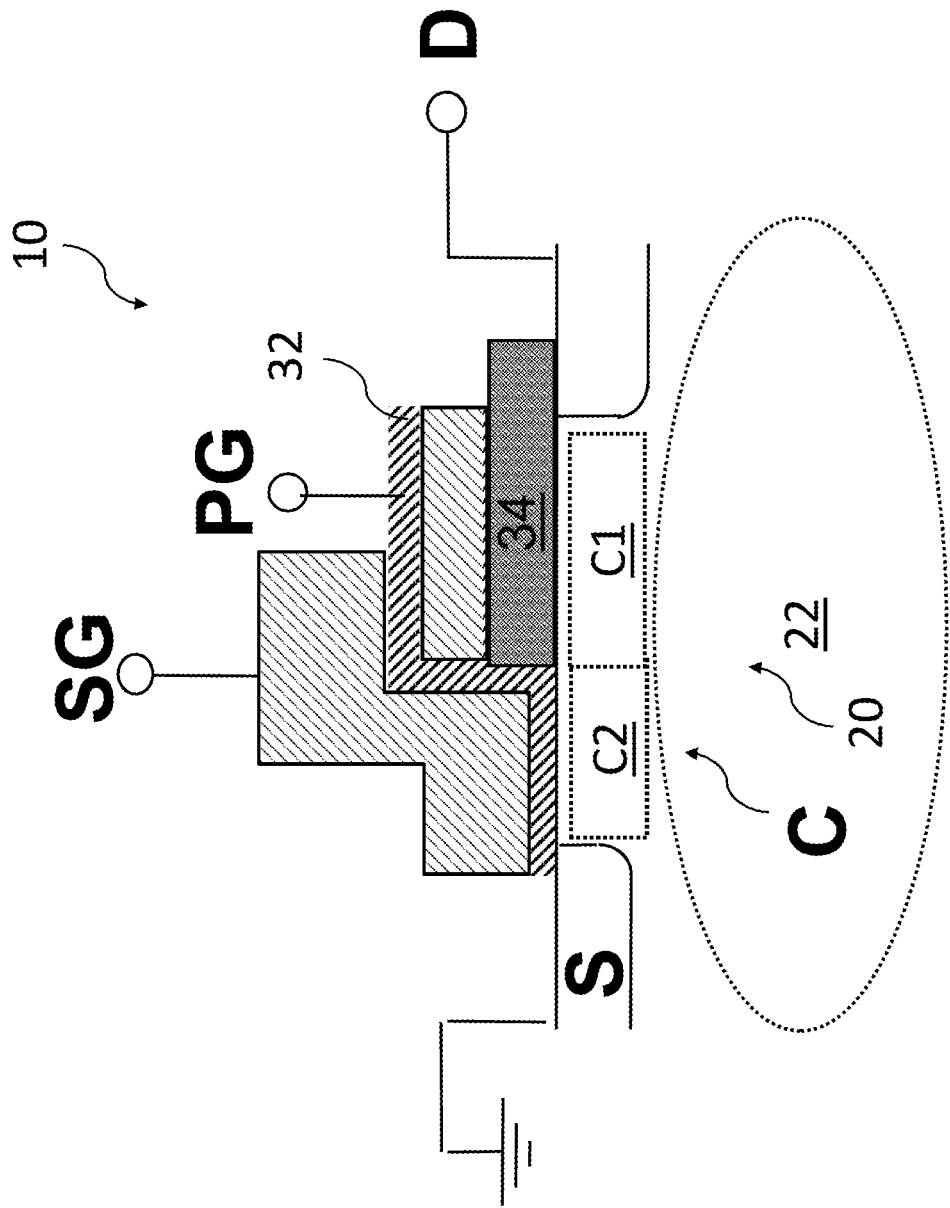
FIG. 3 illustrates a cross-sectional view of a FeFET according to disclosed embodiments.

FIG. 3 illustrates a FeFET 10 similar to the one in FIG. 2. One difference of the FeFET 10 of FIG. 3 compared to the one in FIG. 2 is that the program gate PG is no longer arranged coextensive with the ferroelectric material 34.

The example embodiments of FIGS. 2 and 3 depict planar transistors. However, embodiments of the present invention are not limited to planar geometries, as a person skilled in the art could easily translate the teaching of embodiments of the present invention into 3D structures, like for example using a FinFET architecture. FinFETs are 3D structures that rise above the substrate and resemble a fin, whereby the "fins" form the source, channel and drain, effectively providing more volume than a planar transistor for the same area. The gate wraps around the fin, providing better control of the channel and allowing very little current to leak through the body when the device is in the "off" state. This, in turn, enables the use of lower threshold voltages and may result in better performance and power.

Figure 4:
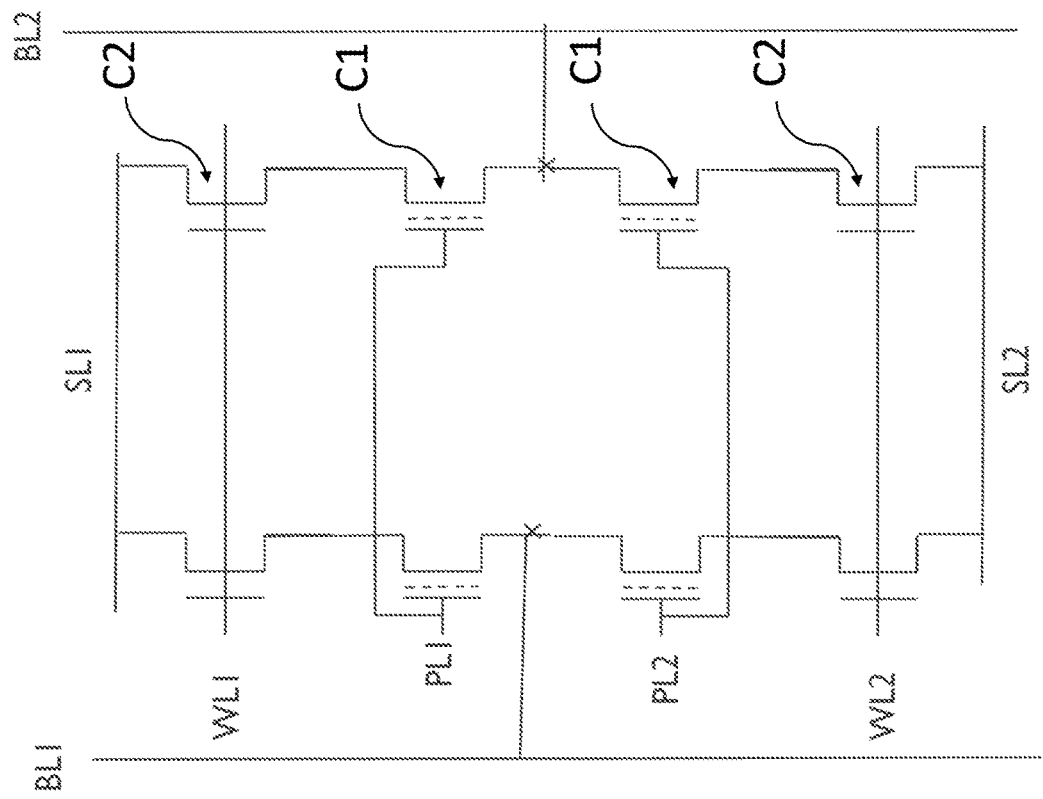
FIG. 4 illustrates an equivalent circuit of a non-volatile memory array comprising FeFETs according to disclosed embodiments.

FIG. 4 illustrates an equivalent circuit of a non-volatile memory array 50 comprising FeFETs as described in relation to FIGS. 2-3. The memory array 50 comprises memory cells comprising FeFETs arranged in rows and columns to form a memory array with source lines SL1, SL2 that may as shown be coupled to a source of each non-volatile memory cell located in a given column; and a bit lines BL1, BL2 physically connected (i.e. in a non-diffused manner) to a drain of each FeFET of the non-volatile memory cells in a given row. The select gate of the FeFETs are connected to a word line WL1, WL2. The array of FIG. 4 also comprises program lines PL1, PL2 for controlling the program gate of the FeFETs of the nonvolatile memory cells.

The main function of the select gates is to be able to cut the current in unselected cells (since all memory transistors are always in the on state). More specifically, the select gates are supplied with an inhibit voltage (e.g. ground or 0V) to cut the current of the unselected cells in the same column to enable better read out. In order not to program or erase these unselected cells on the same row, an inhibit voltage (e.g. ground or 0-2V) may also be applied to the bit lines to reduce the potential drop over the gate dielectric of the FeFETs.

Programming may thereby be selective by using the bit lines BL1, BL2 to inhibit voltages applied by the program lines PL1, PL2, as $V_{PL}$-$V_{BL}$ is then only high enough to program when e.g. $V_{BL}$=0V and e.g. $V_{BL}$=2V may be used to inhibit unselected cells.

An example control scheme for different operations on the memory array 50 of FIG. 4 is shown in Table 1.

TABLE 1

|  | SL | BL | WL | PL | Well |
| --- | --- | --- | --- | --- | --- |
| Prog | 0 | 0 | 0 | 4 | 0 |
| Erase | 4 | 4 | 0 | 0 | 4 |

TABLE 1-continued

|  | SL | BL | WL | PL | Well |
| --- | --- | --- | --- | --- | --- |
| Read | 0 | 1 | 2 | 1.5 | 0 |
| Prog (inhibit) | 0 | 2 | 0 | 4 | 0 |

The rows of Table 1 correspond to different operations and the columns correspond to the different lines of the memory array 50, wherein the cells of the table are applied voltages to the lines in volts.

The memory array 50 is a NOR-type array. Compared to the AND-type array of FIG. 1, the NOR-type array enables a more stable and faster read operation. This because the variability of the conventional FeFETs of FIG. 1 means that e.g. a read current may vary between 1-20 µA in order to ensure a minimum of 1 µA, which increases power consumption and voltage drops.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A ferroelectric field-effect transistor comprising:
   a substrate comprising a source region, a channel including a first portion and a second portion, and a drain region, wherein a well of the substrate extending under both the first portion and the second portion of the channel has a uniform doping level;
   a ferroelectric material extending over both the first portion of the channel and a portion of the drain region;
   a program gate arranged on the ferroelectric material and being at least coextensive with the first portion of the channel;
   a gate dielectric extending over both a portion of the source region and the second portion of the channel; and
   a select gate arranged on the gate dielectric and being at least coextensive with said portion of the source region and the second portion of the channel.

2. The ferroelectric field-effect transistor of claim 1, wherein the uniform doping level is less than $10^{19}$ cm$^{-3}$.

3. The ferroelectric field-effect transistor of claim 2, wherein the program gate is arranged to be coextensive with the ferroelectric material.

4. The ferroelectric field-effect transistor of claim 2, wherein the gate dielectric is further arranged on a portion of the program gate; and wherein the select gate extends above a portion of the program gate with a gate dielectric therebetween.

5. The ferroelectric field-effect transistor of claim 2, wherein the ferroelectric material is hafnia- or wurtzite-based.

6. The ferroelectric field-effect transistor of claim 1, wherein the ferroelectric material is hafnia- or wurtzite-based.

7. The ferroelectric field-effect transistor of claim 6, wherein the program gate is arranged to be coextensive with the ferroelectric material.

8. The ferroelectric field-effect transistor of claim 6, wherein the gate dielectric is further arranged on a portion of the program gate; and wherein the select gate extends above a portion of the program gate with a gate dielectric therebetween.

9. The ferroelectric field-effect transistor of claim 1, wherein the program gate is arranged to be coextensive with the ferroelectric material.

10. The ferroelectric field-effect transistor of claim 9, wherein the gate dielectric is further arranged on a portion of the program gate; and wherein the select gate extends above a portion of the program gate with a gate dielectric therebetween.

11. The ferroelectric field-effect transistor of claim 1, wherein the gate dielectric is further arranged on a portion of the program gate; and wherein the select gate extends above a portion of the program gate with a gate dielectric therebetween.

12. A non-volatile memory array comprising:
a plurality of ferroelectric field-effect transistors, wherein each of the plurality of ferroelectric field-effect transistors includes:
a substrate comprising a source region, a channel including a first portion and a second portion, and a drain region, wherein a well of the substrate extending under both the first portion and the second portion of the channel has a uniform doping level;
a ferroelectric material extending over both the first portion of the channel and a portion of the drain region;
a program gate arranged on the ferroelectric material and being at least coextensive with the first portion of the channel;
a gate dielectric extending over both a portion of the source region and the second portion of the channel; and
a select gate arranged on the gate dielectric and being at least coextensive with said portion of the source region and the second portion of the channel; and
a set of word lines, bit lines, program lines, and source lines electrically connecting the plurality of ferroelectric field-effect transistors;
wherein the word lines are connected to select gates of the ferroelectric field-effect transistors;
the program lines are connected to program gates of the ferroelectric field-effect transistors;
the source lines are connected to source regions of the ferroelectric field-effect transistors; and
the bit lines are connected to drain regions of the ferroelectric field-effect transistors.

13. The non-volatile memory array of claim 12, wherein the bit lines are physically connected to each ferroelectric field-effect transistor in a non-diffused manner.

14. The non-volatile memory array of claim 12, wherein each of the plurality of ferroelectric field-effect transistors reflects a uniform doping level of less than $10^{19}$ cm$^3$.

15. The non-volatile memory array of claim 12, wherein the program gate is arranged to be coextensive with the ferroelectric material.

16. The non-volatile memory array of claim 12, wherein the gate dielectric is further arranged on a portion of the program gate; and wherein the select gate extends above a portion of the program gate with a gate dielectric therebetween.

17. The non-volatile memory array of claim 12, wherein the ferroelectric material is hafnia- or wurtzite-based.

* * * * *